US008582337B2

(12) United States Patent
Koshizuka (10) Patent No.: US 8,582,337 B2
(45) Date of Patent: Nov. 12, 2013

(54) SEMICONDUCTOR MEMORY DEVICE, METHOD OF CONTROLLING READ PREAMBLE SIGNAL THEREOF, AND DATA TRANSMISSION SYSTEM

(71) Applicant: Elpida Memory, Inc., Tokyo (JP)

(72) Inventor: Atsuo Koshizuka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/832,592

(22) Filed: Mar. 15, 2013

(65) Prior Publication Data

US 2013/0223167 A1    Aug. 29, 2013

Related U.S. Application Data

(60) Division of application No. 13/621,074, filed on Sep. 15, 2012, and a continuation of application No. 13/465,818, filed on May 7, 2012, now abandoned, and a continuation of application No. 12/656,060, filed on Jan. 14, 2010, now Pat. No. 8,199,546.

(30) Foreign Application Priority Data

Jan. 20, 2009    (JP) ................. 2009-010251

(51) Int. Cl.
*G11C 15/00*    (2006.01)
(52) U.S. Cl.
USPC ....... 365/49.1; 365/200; 365/193; 365/233.1; 365/194
(58) Field of Classification Search
USPC .................. 365/49.1, 200, 193, 233.1, 194
See application file for complete search history.

(56) References Cited

U.S. PATENT DOCUMENTS

| 6,791,888 B2 | 9/2004 | Kang | |
|---|---|---|---|
| 2003/0156481 A1* | 8/2003 | Fujisawa | ........... 365/200 |
| 2004/0022088 A1 | 2/2004 | Schaefer | |

FOREIGN PATENT DOCUMENTS

JP    2008-198356 A    8/2008

OTHER PUBLICATIONS

JEDEC Standard DDR3 SDRAM Specification, JESD79-3B, Apr. 2008, JEDEC Solid State Technology Association (JEDEC Solid State Technology Association) pp. 37-41.
United States Office Action dated Nov. 5, 2012 in U.S. Appl. No. 13/465,797.

* cited by examiner

*Primary Examiner* — Jason Lappas
(74) *Attorney, Agent, or Firm* — McGinn IP Law Group, PLLC (57) ABSTRACT

A system, includes a controller including a plurality of first external terminals configured to supply a command, a clock signal and an address, and communicate a data, and communicate a strobe signal related to the data, and a semiconductor memory device including a plurality of second external terminals corresponding to the plurality of first external terminals, one of the plurality of first external terminals and one of the plurality of second external terminals transferring an information specifying a length of a preamble of the strobe signal before the semiconductor memory device communicates the data.

20 Claims, 10 Drawing Sheets

| READ PREAMBLE LENGTH | READ PREAMBLE REGISTER SPECIFICATION VALUE | | |
|---|---|---|---|
| | BIT Az | BIT Ay | BIT Ax |
| 1tCK | 0 | 0 | 0 |
| 2tCK | 0 | 0 | 1 |
| 3tCK | 0 | 1 | 0 |
| 4tCK | 0 | 1 | 1 |
| 5tCK | 1 | 0 | 0 |

SEMICONDUCTOR MEMORY DEVICE, METHOD OF CONTROLLING READ PREAMBLE SIGNAL THEREOF, AND DATA TRANSMISSION SYSTEM

REFERENCE TO RELATED APPLICATION

The present application is a Divisional Application of U.S. patent application Ser. No. 13/621,074, filed on Sep. 15, 2012, which is a Continuation Application of U.S. patent application Ser. No. 13/465,845, filed on May 7, 2012, which is a Continuation Application of U.S. patent application Ser. No. 12/656,060, now U.S. Pat. No. 8,199,546, which is based on and claims priority from Japanese patent application No. 2009-010251, filed on Jan. 20, 2009, the entire contents of which is incorporated herein by reference.

TECHNICAL FIELD

The present invention relates to a semiconductor memory device, a method of controlling a read preamble signal thereof, and a data transmission system. In particular, the data transmission system relates to a preferred data transmission system that transmits data between a controller such as a memory controller or the like, and a device to be controlled, that is controlled by the controller, such as a semiconductor memory device or the like, that is to be controlled by the memory controller.

BACKGROUND

The increasing capacities and faster speeds of semiconductor memory devices including dynamic RAM are remarkable. In particular, with regard to DDR SDRAM (Double Data Rate Synchronous DRAM), internal operations are pipelined and given commands are sequentially executed by synchronizing with a clock from outside, and in addition, high speed operation of a system is realized so as to be able to perform data transfer at a rate of double the clock frequency. With the abovementioned DDR SDRAM and the like, a DLL (Delay Locked Loop) circuit is used, an internal circuit is operated by synchronizing with the clock provided from outside, and high speed data transfer is realized.

Figure 1:
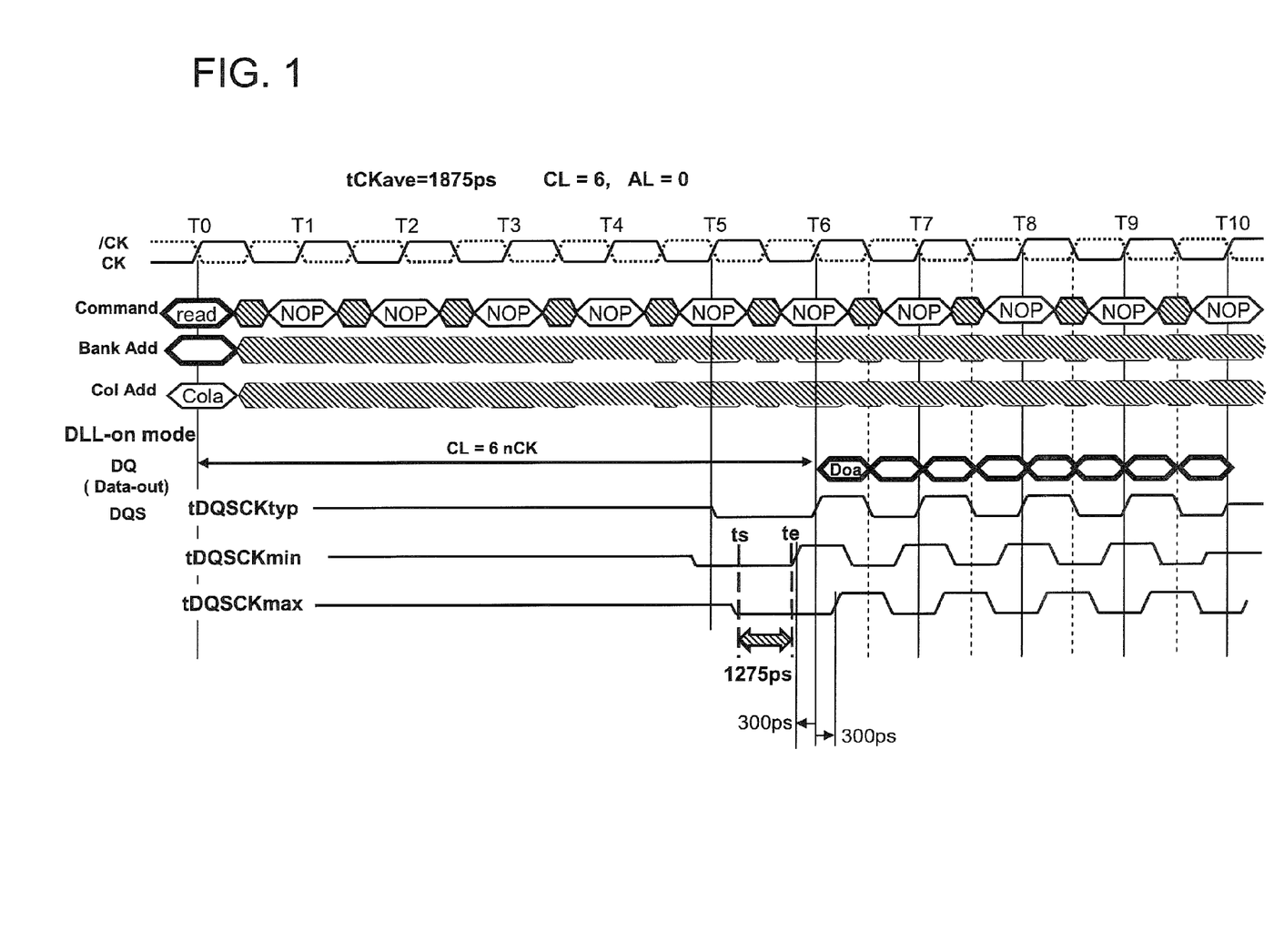
FIG. 1 is a timing diagram for when a read command is executed in a conventional semiconductor memory device.

FIG. 1 is a timing diagram when a read command is executed in this DDR SDRAM. In FIG. 1, "CK" is a system clock signal provided by a memory controller to a CK terminal of the DDR SDRAM, and "/CK" is an inverted signal thereof provided to a /CK terminal. In FIG. 1, the CK signal is shown by a full line, and /CK is shown by a broken line. Furthermore "Command" indicates a command given by the memory controller to the DDR SDRAM, and "Bank Add" and "Col Add" indicate a bank address and a column address at that time. In addition, when a read command has been inputted, data outputted from a DQ terminal (data terminal) of the DDR SDRAM, and a data strobe signal outputted from a DQS terminal (data strobe terminal) are indicated by "DQ" and "DQS". With regard to the data strobe signal, in addition to the DQS signal, a /DQS signal that is an inverted signal thereof is outputted from a /DQS terminal, but this is omitted in FIG. 1.

Furthermore, in addition to a standard DQS output signal, the drawing also shows fastest and slowest timing for when output timing of the DQS signal varies. Moreover, CAS latency is CL=6, and Additive Latency is AL=0.

In FIG. 1, first, at a rising edge at timing T0, a read command is given to the DDR SDRAM. In a standard DDR SDRAM, since a DLL is built in, phases of the system clock signals CK and /CK provided from the memory controller side, and the phase of a signal outputted from the DDR SDRAM to the DQS terminal, match. As described above, with the CAS latency CL of 6, since the additive latency AL is 0, after the DQS terminal outputs one cycle at low level as a read preamble in advance, it rises in synchronization with rising of the system clock of a sixth clock, T6. Thereafter, toggle operation is repeated in synchronization with the system clock until burst output is completed. At this time, data is outputted in synchronization with rising and falling of the DQS terminal, from the DQ terminal. Since the DQS signal outputted from the DDR SDRAM is made synchronous by a DLL circuit with the system clock signals CK and /CK provided from the memory controller side, there is little phase shift. A DQS signal line is a bidirectional signal line, with cases of output as a data strobe signal from the DDR SDRAM to the memory controller side, and cases of output as a data strobe signal from the memory controller side to the DDR SDRAM. Therefore, where data is not outputted in either type of case, there is a high impedance state, with an intermediate potential, according to a termination resistance.

Therefore, with regard to a DDR SDRAM specification, when data is outputted, prior to the data output, a low level preamble signal is outputted for a one cycle period of the CK signal. For example, as shown in FIG. 1, when the DDR SDRAM outputs read data, a read preamble signal is outputted from the DQS terminal one cycle beforehand, and this read preamble signal is received in the memory controller, and a state of waiting for the read data reception is entered.

A mismatch of falling and rising edges of the DQS terminal and the /DQS terminal of the DDR SDRAM with respect to falling and rising edges of the CK terminal and the /CK terminal is specified as tDQSCK. With a case where a value of this tDQSCK is 0 (an ideal case), as tDQSCKtyp, a minimum value of variation is indicated as tDQSCKmin, and a maximum value is indicated as tDQSCKmax. In a normal DDR SDRAM, since a DLL circuit is used and the phase of the DQS signal is matched with the system clock, there is little variation. In FIG. 1, with regard to a time-period from ts to te, the preamble signal is outputted in cases of both tDQSCKmin and tDQSCKmax. Therefore, in the memory controller, it is possible to relatively easily detect the preamble signal, and in that regard, with an average period tCKave of the system clock CK as 1875 ps, if tDQmin is −300 ps and tDQSCKmax is 300 ps, a time-period from ts to te is 1275 ps, according to Expression (1). However, in actuality, since there is a propagation delay in wiring from the DDR SDRAM to the memory controller, and a variation thereof, this type of accurate time length does not occur.

$$1875 \text{ ps} - 300 \text{ ps} - 300 \text{ ps} = 1275 \text{ ps} \qquad \text{Expression (1)}$$

Figure 2:
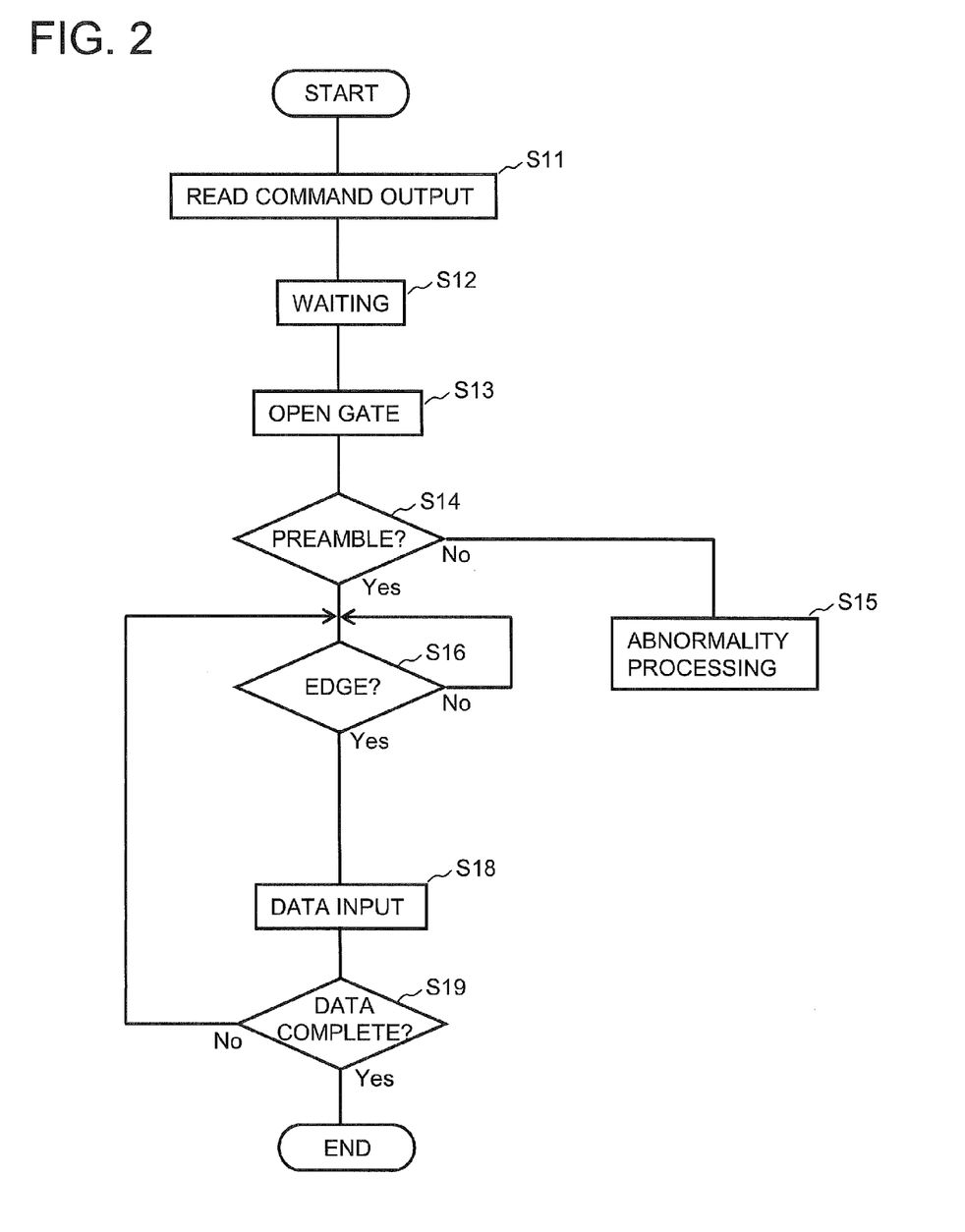
FIG. 2 is a control flow diagram of a memory controller when a read operation is performed in a conventional semiconductor memory device.

FIG. 2 is a control flow diagram of the memory controller when a read command is executed. With regard to the memory controller, after outputting a read command in step S11, and after waiting CAS latency—one cycle in step S12, a gate detecting the DQS signal is opened in step S13, and the read preamble signal is detected. If timing of opening the gate is made at a time at which a propagation delay is added to a time-period from the abovementioned ts until te, even in a case where the tDQSCK varies, ideally it is possible to detect the preamble signal in one time (step S14). In a case where the preamble cannot be detected, since there is some sort of abnormality, there is a transition to abnormality processing (step S15). On the other hand, in a case where the preamble signal is normally detected, there is a transition to detection processing of a toggle edge (step S16). In a case where the toggle edge could be detected, with regard to a memory read operation, since the DQS signal and the DQ signal change at the same time, the DQ signal is taken up in an intermediate time until the next edge at which DQ signal change has become stable (step S18). An operation from the toggle edge detection of step S16 until the DQ signal of step S18 is taken up is repeated until the data is completed, and at the completion of the data, the read operation is finished (step S19). Patent Document 1 describes a circuit in which a read preamble signal is generated in the DDR SDRAM. In the abovementioned description, it is assumed throughout that the DDR SDRAM has a built-in DDL circuit, and that the phase of the DQS output signal matches the phase of the CK signal with good accuracy.

On the other hand, there is a demand for reduction in power consumption in semiconductor memory devices, not limited to devices such as notebook PCs that operate on batteries, but also in the area of servers and the like. However, since the clock must always be operated at high speed, the DLL is a cause of power consumption increase. With regard to this, there is a description on page 37 of Non-Patent Document 1, of providing a DLL OFF mode in which the DLL is turned OFF, in a DDR3 SDRAM, which is the latest specification of the abovementioned DDR SDRAM. According to Non-Patent Document 1, there is a description that, the DLL OFF mode is used with the CAS latency CL=6, and the DQS signal when a read operation is performed is generated from a timing signal one cycle before, with regard to a DLL ON mode.

[Patent Document 1]
JP Patent Kokai Publication No. JP-P2008-198356A
[Non-Patent Document 1]
JEDEC STANDARD DDR3 SDRAM Specification, JESD79-3B, April, 2008, JEDEC Solid State Technology Association, page 37

SUMMARY

The entire disclosures of Patent Document 1 and Non-Patent Document 1 are incorporated herein by reference thereto. The following analysis is given by the present invention. As mentioned above, there is a description of providing a DLL OFF mode, in a DDR3 SDRAM. However, since there are various problems in semiconductor memory devices using a high speed data transfer rate as in the DDR3 SDRAM, it is considered that in actuality the DLL OFF mode is hardly used. One reason for this is that, as described below, with conventional memory controllers, it is difficult to detect a read preamble signal with suitable timing to receive head data of read data without error.

Figure 3:
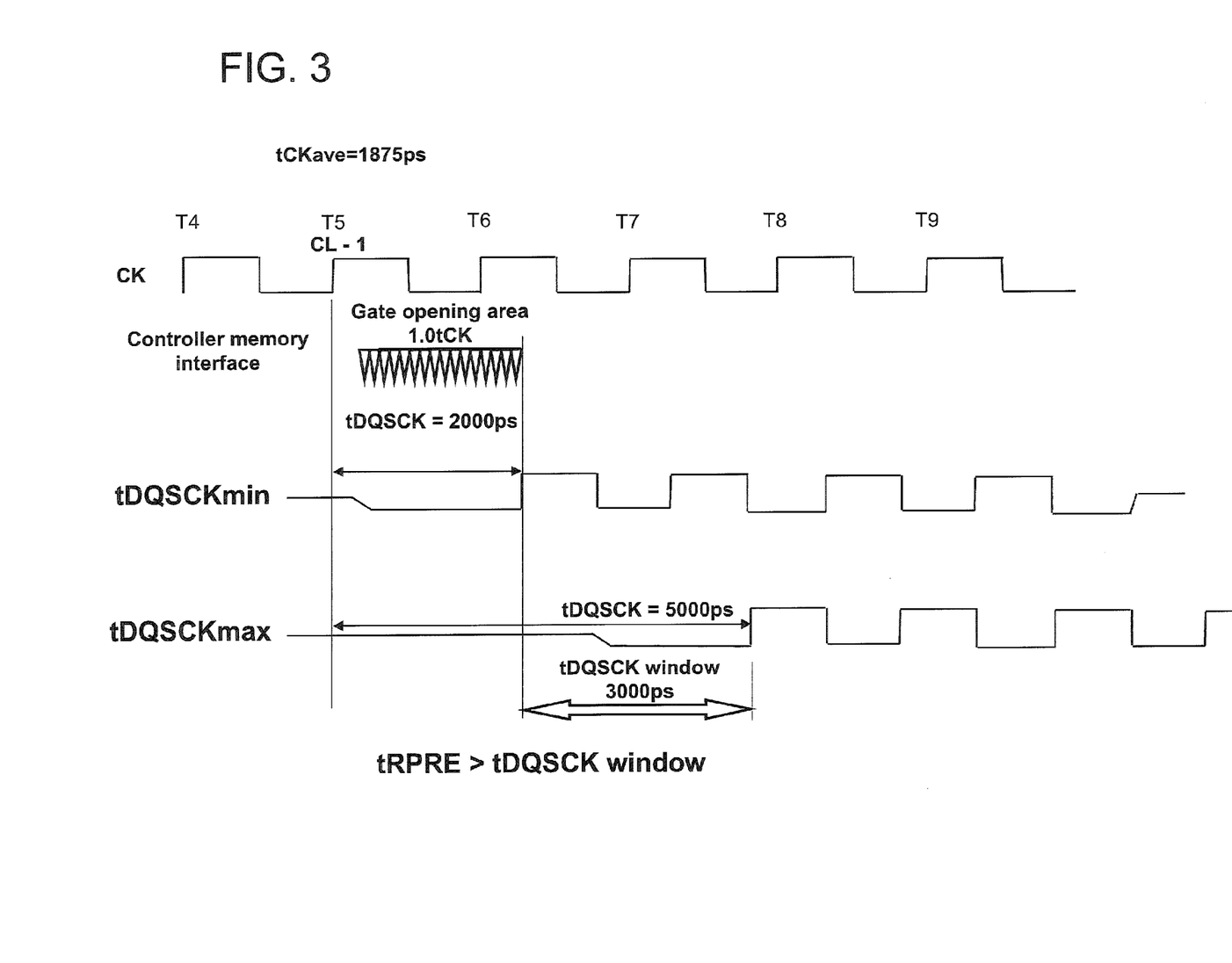
FIG. 3 is a timing diagram for when a read command is executed in a case assuming non-usage of a DLL circuit in a conventional semiconductor memory device.

FIG. 3 is a timing diagram in which output of the read data is started in the DDR3 SDRAM. As described above, according to Non-Patent Document 1, in the DLL OFF mode a DQS signal is controlled, with an edge of a CK signal one cycle earlier than a CK signal specified by CAS latency, as a reference. In FIG. 3, since the CAS latency CL=6 similar to FIG. 1, in the DLL OFF mode the DQS signal is generated, with an edge of a clock T5 one cycle before T6 that is the sixth cycle after receiving the read command, as a reference.

However, since it is not possible to adjust the phase of an internal clock so that the phase of the CK signal matches the phase of the DQS signal, by the DLL circuit as in the DLL ON mode, the internal clock has a phase delay with regard to the CK signal. This phase delay appears as a phase delay time tDQSCK (DLL OFF mode) of the DQS signal with respect to the CK signal, and a numerical value thereof is 2000 ps to 5000 ps approximately. That is, the tDQSCK (DLL OFF mode) is a number larger by an order of magnitude or more than a tDQSCK (DLL ON mode) when the DLL is ON as described already, and since an internal clock necessarily has a phase delay with respect to the CK signal provided from outside, there is a difference in that the tDQSCK (DLL OFF mode) is a positive number. As may be understood easily from FIG. 3, for a tDQSCKmin where the phase delay is smallest, a read preamble time-period is already ended, and at timing at which a toggle operation is entered, for a tDQSCKmax where the phase delay is largest, it is still before transmission of the read preamble.

Figure 4:
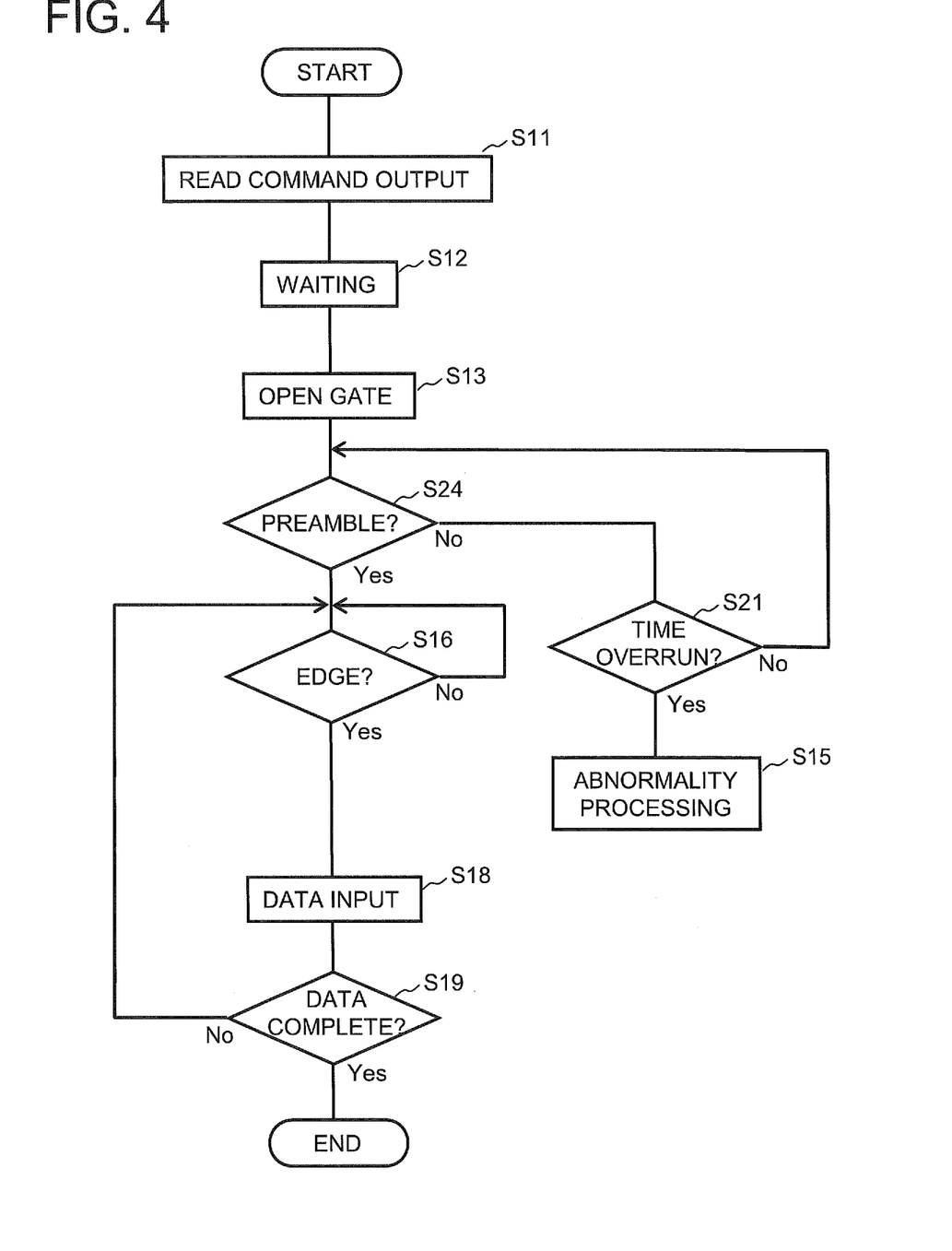
FIG. 4 is a control flow diagram of a memory controller in a case assuming non-usage of a DLL circuit in a conventional semiconductor memory device.

In this type of case, there exists no timing at which the read preamble signal can be assuredly detected even when the delay time-period of a DDR SDRAM such as timing from ts to te as shown in FIG. 1 varies. In this type of case, the memory controller cannot normally read the read data, in control flow shown in FIG. 2. If an attempt is made to correctly receive read data output timing variations as shown in FIG. 3 by the memory controller, a control flow diagram as in FIG. 4 is necessary. In FIG. 4, processing of step S14 of FIG. 2 is replaced by loop processing of step S24 and step S21. That is, in order to correctly read the read data in a case of tDQSCKmin, a gate must be opened before the tDQSCKmin starts the toggle operation (step S13), and a detection operation of the read preamble must be entered step S24). However, with this timing, since the tDQSCKmax has not yet reached transmission timing of the read preamble, the preamble signal cannot be detected in the first detection, and with this only, abnormality processing cannot be performed. Processing waits until it is possible to detect the preamble, and in a case where the read preamble signal cannot be detected even at timing at which the tDQSCKmax should enter the read preamble time-period, for the first time it is possible to perform abnormality processing.

That is, for a controller on a side that controls the DDR SDRAM, it is considered necessary to perform a design change from detection processing for a conventional read preamble signal. Furthermore, since high speed in detection of the DQS signal is required, implementation by software is difficult, and it is considered that a dedicated DLL OFF mode DQS detection circuit is necessary.

According to a first aspect of the present invention a system includes a controller comprising a plurality of first external terminals configured to supply a command, a clock signal and an address, and communicate a data, and communicate a strobe signal related to the data, and a semiconductor memory device including a plurality of second external terminals corresponding to the plurality of first external terminals, one of the plurality of first external terminals and one of the plurality of second external terminals transferring an information specifying a length of a preamble of the strobe signal before the semiconductor memory device communicates the data.

Furthermore, according to another aspect of the present invention, a system includes a semiconductor memory device and a controller, the semiconductor memory device includes a first external terminal provided to receive a clock signal, a second external terminal provided to receive a read command, a third external terminal configured to output a data strobe signal in response to the read command, the data strobe signal including a read preamble and a toggle transition following to the preamble, a fourth external terminal provided to output a read data in synchronization with the toggle transition of the data strobe signal, and a control circuit configured to control a length of the read preamble of the data strobe signal based on a preamble length information, the controller includes a fifth external terminal provided to output the clock signal, a sixth external terminal provided to output the read command, a seventh external terminal provided to receive the read data, an eighth external terminal provided to receive the data strobe signal related to the read data, and a ninth external terminal provided to output the preamble length information.

In addition, according to another aspect of the present invention, a system includes
a semiconductor memory device and a controller, the semiconductor memory device includes
a first external terminal provided to receive a clock signal, a second external terminal provided to transfer a data with the controller in synchronization with the clock signal,
a third external terminal provided to receive a command for communicating the data,
a control circuit configured to produce a data strobe signal, which includes a preamble and a toggle transition following to the preamble, so that the transferring the data is conducted by the toggle transition of the data strobe signal, and a fourth external terminal provided to be supplied an information specifying a length of the preamble of the strobe signal,
the controller, includes a fifth external terminal provided to output the clock signal, a sixth external terminal provided to communicate the data, a seventh external terminal configured to output the command, and an eighth external terminal configured to output the information.

The meritorious effects of the present invention are summarized as follows.

According to the present invention, it is possible to provide a semiconductor memory device in which a controller that reads read data can transmit data easily without the occurrence of missing head data. Furthermore, a data transmission system can perform transmission of data at high speed without leakage of received data.

PREFERRED MODES

Modes of the present invention are described making reference to the drawings as necessary. The drawings cited in the description of the modes and reference symbols of the drawings are shown as an example of the modes, and are not intended to limit variations of the modes of the present invention thereby.

Figure 6:
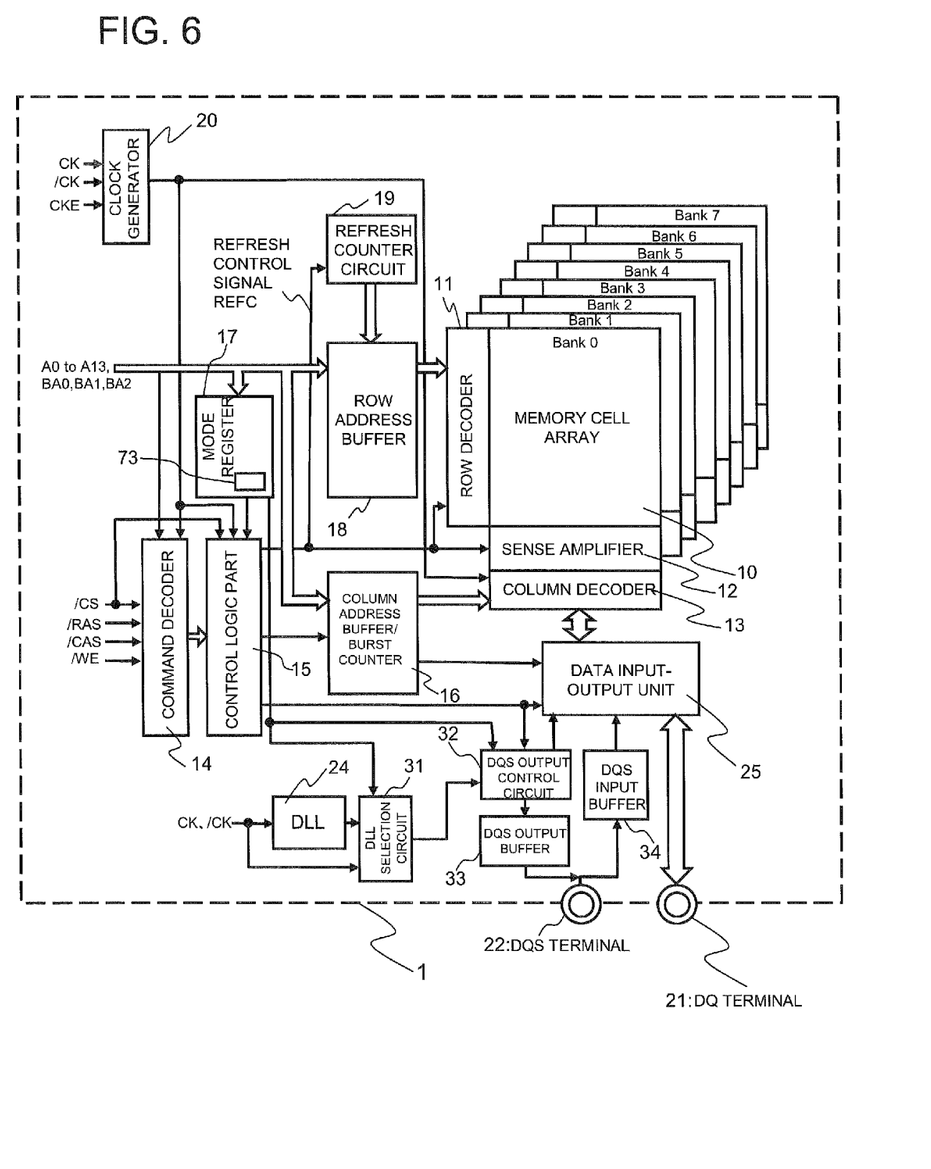
FIG. 6 is a configuration diagram of an overall semiconductor memory device according to one exemplary embodiment of the present invention.

A semiconductor memory device 1 of a mode of the present invention, as shown in FIG. 6 for example, operates in synchronization with a system clock CK provided from outside, outputs a data strobe signal DQS from a data strobe terminal 22 when a read command is executed, and outputs read data DQ in synchronization with the data strobe signal DQS, and includes: a read preamble register 73 that specifies length of a read preamble to be outputted prior to output of the read data, and a data strobe signal output control unit 32 that starts operation according to receipt of the read command, and outputs a read preamble signal of the length specified by the read preamble register 73 prior to timing of starting output of the read data determined in advance, followed by outputting a data strobe signal DQS to the data strobe terminal 22, from the timing of starting output of the read data. Since it is possible to change the length of the read preamble by the read preamble register, the semiconductor memory device does not have a synchronizing circuit such as a DLL, PLL or the like, and even in a case where output timing of the data strobe signal varies, it is possible to lengthen the read preamble signal length according to this variation. Therefore, it is possible to assuredly start detection of the data strobe signal in the read preamble time-period. Furthermore, since it is possible to change the read preamble length from a relationship of size of the variation and clock frequency, there is no risk of lengthening the read preamble more than necessary and of lowering transmission efficiency of the data.

Furthermore, the semiconductor memory device 1 of a mode of the present invention, as shown in FIG. 6, further includes: a DLL circuit 24, and a DLL selection circuit 31 that switches between a DLL selection mode in which phase is adjusted with respect to a system clock CK using the DLL circuit 24 and read data is transmitted, and a DLL non-selection mode in which read data is outputted with the system clock as reference, without using the DLL circuit 24, and changes a reference of the number of clocks of the system clock, from the read command being inputted, to starting output of the read data, in the DLL selection mode and the DLL non-selection mode. Therefore, the number of system clocks CK from the read command being inputted until starting output of the read data in the DLL non-selection mode may be different from the number of clocks thereof in the DLL selection mode. In the DLL non-selection mode, since the phase of an internal clock generated from the system clock is necessarily delayed, the phase of a data strobe signal generated from this delayed internal clock is also delayed. Therefore, it is possible to select a preceding edge as an edge of a clock that is a reference for starting read data output so as to compensate for this phase delay. The data preamble signal is outputted further preceding the timing of starting this read data.

Furthermore, in the semiconductor memory device 1 according to a mode of the present invention, as shown in FIG. 6 for example, the read preamble length prior to the read data output is the length specified by the read preamble register 73 when the DLL selection circuit 31 is in the DLL non-selection mode, and is a fixed length that does not depend on the value of the read preamble register when the DLL selection circuit 31 is in the DLL selection mode. That is, when it is possible to select the DLL selection mode and the non-selection mode, in the DLL selection mode, since there is little phase error of the data strobe signal with respect to the system clock, the read preamble length may be fixed. However, in the DLL non-selection mode, when the DLL circuit is not used, since variation of phase delay of the data strobe signal becomes large with respect to the system clock CK signal, it is possible to change the read preamble time-period in accordance with a relationship between this variation and the clock frequency.

Furthermore, the semiconductor memory device 1 according to a mode of the present invention, as shown in FIG. 6 for example, further includes: the DLL circuit 24, and the DLL selection circuit 31 that switches between a DLL selection mode in which the phase is adjusted with respect to the system clock CK using the DLL circuit 24 and read data is outputted, and a DLL non-selection mode in which read data is outputted with the system clock CK as reference, without using the DLL circuit 24; wherein the length of the read preamble prior to read data output is the length specified by the read preamble register when the DLL selection circuit 31 is in the DLL non-selection mode, and is a fixed length that does not depend on the value of the read preamble register when the DLL selection circuit 31 is in the DLL selection mode.

Furthermore, in the semiconductor memory device 1 according to a mode of the present invention, as shown in FIG. 6 for example, the data strobe signal output control unit 32 performs toggle output of the data strobe signal DQS from the data strobe terminal 22 based on the system clock CK until completion of output of the read data, outputs a postamble signal after the output of the read data is completed, and thereafter puts the data strobe terminal in an output high impedance state, to complete output processing of the read data.

In addition, a method of controlling a read preamble signal of the semiconductor memory device 1 according to a mode of the present invention operates in synchronization with the system clock provided from outside, outputs the data strobe signal DQS from the data strobe terminal 22 when the read command is executed, and outputs the read data DQ in synchronization with the data strobe signal DQS, has a DLL selection mode in which the phase is adjusted with respect to the system clock CK using the DLL 24 circuit and the read data is outputted, and a DLL non-selection mode in which the read data is outputted with an internal clock as a reference, without using the DLL circuit, and the read preamble signal is outputted from the data strobe terminal 22 prior to output of the read data, wherein the read preamble signal length is lengthened with respect to the system clock period of the DLL non-selection mode more than the DLL selection mode. That is, if the DLL is OFF in the DLL non-selection mode, it is possible to reduce power consumption, but variation of output timing of the read data becomes large. However, by lengthening the read preamble signal length with respect to the system clock period in the DLL non-selection mode, a memory controller can suitably select a starting time for detection of the data strobe signal. Since the read preamble signal length is lengthened with respect to the system clock period in the DLL non-selection mode, it is possible for the read preamble to be recognizable by a data reception side, without largely decreasing or changing system clock frequency in the DLL non-selection mode with respect to the DLL selection mode. Read data transmission speed in the DLL non-selection mode does not decrease greatly with respect to the DLL selection mode.

Figure 9:
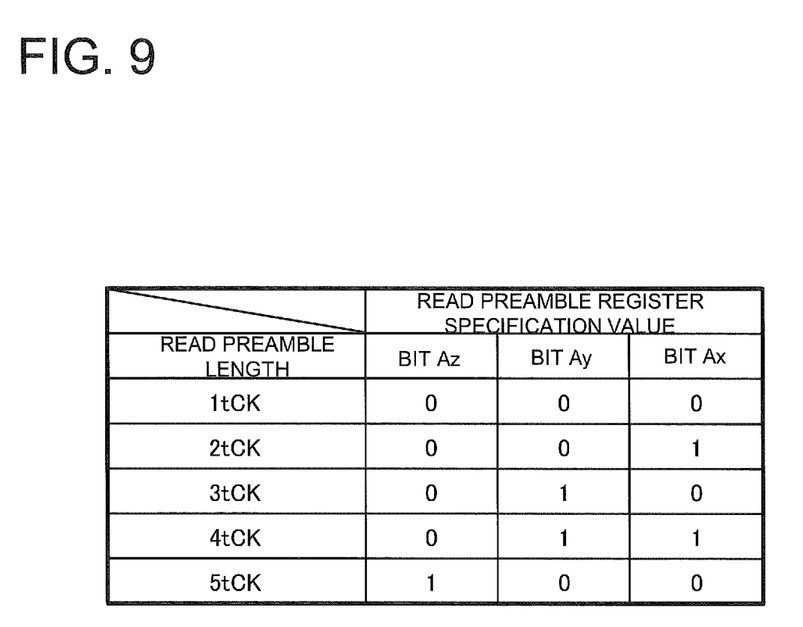
FIG. 9 is a functional configuration diagram of a read preamble register of a semiconductor memory device according to one exemplary embodiment of the present invention.

Furthermore, in the method of controlling a read preamble signal of the semiconductor memory device 1 according to a mode of the present invention, as shown in FIG. 6 and FIG. 9 for example, the read preamble register 73 specifying the read preamble signal length to the semiconductor memory device 1 is provided and the read preamble signal length is controlled by a setting value of the read preamble register 73. If an arrangement is such that the read preamble register can be set from the memory controller, it is possible to determine a suitable read preamble length giving consideration to variation and the like of start timing for data transmission in the semiconductor memory device 1. If the read preamble length is long, it becomes easy for the memory controller to detect data transmission start timing of the read data, but if the read preamble length is unnecessarily long, lowering of transmission efficiency results.

Moreover, in the method of controlling a read preamble signal of the semiconductor memory device 1 according to a mode of the present invention, the larger the CAS latency, which is the number of clocks of the system clock from giving a read command until starting output of first data, the longer the read preamble signal length is set. A phase shift between the system clock and the data strobe signal becomes relatively large as the frequency of the system clock becomes high and the transmission rate increases. Therefore, in order that the memory controller correctly detects start timing of the transmission of the read data, it is desirable that the more the system clock frequency is increased and latency is raised, the longer the read preamble length is set.

Figure 5:
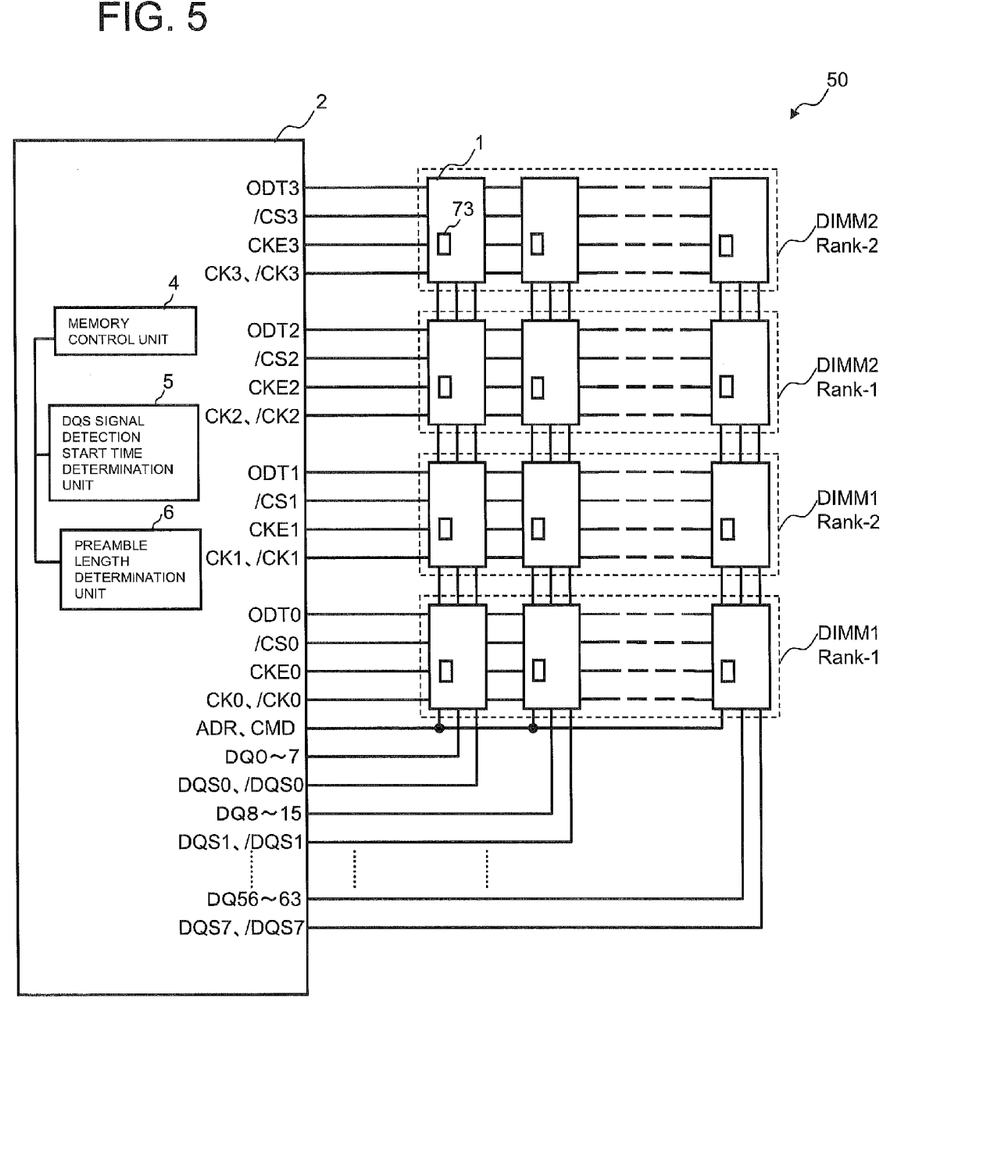
FIG. 5 is a configuration diagram of an overall data transmission system (memory system) according to one exemplary embodiment of the present invention.

A data transmission system 50 according to a mode of the present invention, as shown in FIG. 5 for example, includes: a controller 2; a controlled device 1 to which system clocks CK0 to CK3 are supplied and which responds to an instruction from the controller 2 to perform input and output of data with respect to the controller 2; transmission data lines DQ0 to DQ63 that connect the controller 2 and the controlled device 1 and perform input and output of data; and transmission clock lines DQS0 to DQS7 that are bidirectional and that connect the controller 2 and the controlled device 1, and when the controller 2 performs input of data from the controlled device 1, the transmission clock lines DQS0 to DQS7 send transmission clocks generated by the system clocks CK0 to CK3 to the controller 2 from the controlled device 1 in synchronization with a transmission data transmitted to the transmission data lines DQ0 to DQ63; and further includes a preamble length resister 73 that determines length of a preamble signal to be outputted to the transmission clock lines DQS0 to DQS7 prior to the controlled device 1 starting transmission of data to the controller 2; wherein the controller 2 sets the preamble length register 73 of the controlled device beforehand, and decides a time from giving an instruction of data input to the controlled device, to starting detection of the transmission clock transmitted by the controlled device, giving consideration to a frequency of the system clock, a set value of the preamble length register, a response time of the controlled device with respect to the instruction of the controller, and a variation of phase delay of the transmission clock outputted by the controlled device with respect to the system clock. The semiconductor memory device can be considered to be the controlled device that responds to the instruction from the controller, to perform input and output of data with respect to the controller. Furthermore, a memory system configured from the memory controller and the semiconductor memory device can be considered as a data transmission system that performs data transmission between the controller and the controlled device that performs input and output of data in synchronization with the instruction given from the controller, with system clock synchronization. The controller starts detection of the transmission clock at a preferable timing, giving consideration to variation of phase delay and the like, of the transmission clocks outputted by the controlled device with respect to the system clock.

Furthermore, in the data transmission system 50 according to a mode of the present invention, as shown in FIG. 5, the controller 2 gives consideration to the frequency of the system clocks CK0 to CK3 and the phase delay variation, sets the preamble length register 73 so that transmission time-period of the preamble signals overlap in a case of maximum variation and a case of minimum variation, and even when the variation is minimum, detection of the transmission clock transmitted by the controlled device is started before the transmission time-period of the preamble signal ends. By the controller starting sensing of the transmission clock signal at a timing at which the preamble signal is outputted even if there is a phase shift of the transmission clock outputted by the controlled device, it is possible to detect an initial edge of the transmission clock that is the start of data transmission, relatively easily and accurately. For example, if detection of the transmission clock signal is started from before preamble signal transmission, a transmission clock line has a high impedance unstable state even if a termination resistance or the like is present. If the controller starts detection of voltage level of the transmission clock line in this state, there is a risk of mistakenly detecting noise as a toggle signal of the transmission clock.

Furthermore, the data transmission system 50 according to a mode of the present invention starts detection of the transmission clock transmitted by the controlled device after a start of a transmission time-period of the preamble signal even if the variation is maximum. If sensing of the preamble signal (transmission clock line) is started after a creation time-period of the preamble signal has started even when the transmission clock signal phase delay variation is largest (largest delay), there is no mistaken detection of noise when the transmission clock line is in a high impedance state, as a transmission clock and edge.

Moreover, the data transmission system 50 according to an embodiment of the present invention starts detection of the transmission clock signal a fixed time-period before a transmission time-period of the preamble signal ends, in a case where variation is minimum. For example, if activating a gate for detecting the transmission clock increases a power consumption of the controller, it is preferable to delay a starting of detection of the transmission clock signal as much as possible. If this is done, the above-mentioned detection starting time occurs. If the detection starting is delayed more than as described above, a risk occurs that an initial edge cannot be recognized. A detailed description is given below according to an exemplary embodiment, making reference to the drawings.

Example 1

FIG. 5 is a configuration diagram of an overall memory system according to an example of the present invention. FIG. 5 is a 64-bit parallel read-write memory system. A semiconductor memory device 1 is an 8-bit parallel read-write device, and 8 semiconductor memory devices 1 are connected in parallel to perform 64-bit parallel reading and writing. Furthermore, in the memory system of FIG. 5 a configuration is assumed in which 2 ranks of the semiconductor memory devices 1 are mounted on each of two DIMMs (Dual Inline Memory Module). That is, the configuration is of a total of 4 ranks of semiconductor memory devices, DIMM1 Rank-1, DIMM1 Rank-2, DIMM2 Rank-1, DIMM2 Rank-2, and each rank further includes 8 semiconductor memory devices 1. The total number of semiconductor memory devices 1 mounted is 4 (ranks)×8=32. In FIG. 5, only 3 semiconductor memory devices 1 among the 8 semiconductor memory devices 1 that are connected in parallel are illustrated. Signals that control these 32 semiconductor memory devices 1 are given by a memory controller 2, and data input and output are performed with respect to the memory controller.

In FIG. 5, the memory controller 2 is directly connected to each semiconductor memory device 1, but a PLL or buffer register may be disposed for each DIMM between the memory controller 2 and the semiconductor memory devices 1, and the configuration may realize synchronization of timing with the memory controller for each DIMM, with what is called a Registered DIMM or a Fully Buffered DIMM (FB-DIMM). Moreover, the memory controller 2 may be an LSI circuit having a dedicated memory control function, and a CPU may directly control memory. Furthermore, the memory controller 2 may be configured of a plurality of LSI circuits.

In FIG. 5, ADR and CMD are address and command signals, and are linked in common to the semiconductor memory devices 1 of each rank from the memory controller 2. The command signal CMD includes a row address strobe signal /RAS, a column address strobe signal /CAS, and a write enable signal /WE. Signals DQ0 to DQ63 are bidirectional data input-output signals used in read-write data transfer and the like between the memory controller 2 and the semiconductor memory devices 1. Since the semiconductor memory devices 1 are assumed to be 8-bit parallel input-output devices, in order to cover 64 bits of DQ0 to DQ63, 8 semiconductor memory devices 1 are connected in parallel. The DQ0 to DQ63 data input-output signals are also commonly connected to each rank. Furthermore, signals DQS0 to DQS7 and signals /DQS0 to /DQS7, each being a differential data strobe signal, are strobe signals of data to be transferred from the memory controller 2 to the semiconductor memory devices 1 when performing a write operation, and from the semiconductor memory devices 1 to the memory controller 2 when performing a read operation, and are bidirectional input-output signals. Since the data strobe signals DQS and /DQS outputted by the semiconductor memory devices 1 when performing a read operation are synchronous with a read data change point, when used as a strobe signal on the memory controller 2 side, they are used by shifting phase at timing at which a data signal can be latched. These data strobe signals DQS0 to DQS7 and /DQS0 to /DQS7 are also commonly linked to the semiconductor memory devices of each rank. However, independent DQS signals and /DQS signals are linked respectively to the 8 semiconductor memory devices 1 that are connected in parallel in each rank.

Furthermore, clock signals CK0 to CK3 and /CK0 to /CK3, clock enable signals CKE0 to CKE3, chip select signals /CS0 to /CS3, and built-in termination resistance control signals ODT0 to ODT3 are signals outputted from the memory controller 2 to the semiconductor memory devices 1, and separate signals are independently outputted for each rank. The clock signals CK0 to CK3 and /CK0 to /CK3 are signals given as system clocks to the semiconductor memory devices 1, and read-write commands and the like given to the semiconductor memory devices 1 by the memory controller 2 are also given in synchronization with the system clock. The clock enable signals CKE0 to CKE3 are signals that determine whether a clock CK is valid or invalid. In a case where a CKE has a high level with a rising edge of the clock CK, a subsequent CK rising edge is valid. Otherwise, the subsequent CK rising edge is invalid. With respect to the chip select signals /CS0 to /CS3, for a low level, a command input is valid. When /CS0 to /CS3 have a high level, a command is ignored; however, operation is continued. Using the chip select signals, a command is given to a semiconductor memory device 1 of an arbitrary rank, among the semiconductor memory devices 1 of the plural ranks, and selective access is possible. Furthermore, when a value of a termination resistance built into each of the semiconductor memory devices 1 is not infinite, the built-in termination resistance control signals ODT0 to ODT3 can perform ON-OFF control of the termination resistance.

In FIG. 5, each semiconductor memory device 1 is provided with a read preamble register 73. As described in detail later, by each of the semiconductor memory devices 1 being provided with the read preamble register 73, it is possible to change the length of a read preamble signal outputted to the data strobe signal lines DQS0 to DQS7 and /DQS0 to /DQS7 prior to read data output. If it is possible to increase length for a system clock period of a read preamble signal of each semiconductor memory device 1, even if there is variation in phase shift with regard to the system clock of the data strobe signals DQS0 to DQS7 and /DQS0 to /DQS7 outputted by each semiconductor memory device 1 when a read command is executed, the memory controller 2 can set the read preamble length to a length at which it is possible to detect easily and without error the data strobe signals DQS0 to DQS7 and /DQS 0 to /DQS7 outputted by the semiconductor memory devices when a read command is executed.

The memory controller 2 includes a memory control unit 4 that gives a command to a semiconductor memory device 1, sets a mode register or the like of the semiconductor memory device 1, and performs input and output of read-write data. Furthermore, the memory controller 2 includes a DQS signal detection start time determination unit 5 and a preamble length determination unit 6. The preamble length determination unit 6 gives consideration to variation of delay time of the DQS signals with regard to the system clock of the semiconductor memory device 1 when a read command is executed, and determines the read preamble length. Based on the length determined by the preamble length determination unit 6, the memory control unit 4 sets the read preamble length in the read preamble register 73 of the semiconductor memory device 1. The preamble length determination unit 6, in FIG. 3 for example, determines the length of the read preamble so that a time-period (for example, the time-period ts to te in FIG. 1) occurs in which the read preamble time-period of tDQSCKmax overlaps the read preamble time-period of tDQSCKmin. Values of tDQSCKmax and tDQSCKmin of the semiconductor memory device and frequency of the system clock CK are known in advance.

Furthermore, at system start-up time or for each fixed time interval, the memory controller 2 may perform a data read test for the semiconductor memory device 1, may measure tDQSCK values, and may determine the preamble length according to measured values of the tDQSCKmax and tDQSCKmin that have been thus measured. The determined read preamble length is set in the read preamble register 73 by the memory control unit 4.

The DQS signal detection start time determination unit 5, based on the read preamble length set in the read preamble register 73, the values of the tDQSCKmax and tDQSCKmin, and the frequency of the system clock CK, makes a DQS signal detection start time determination so as to start detection of the DQS signal before an initial edge (at timing te in FIG. 1) in a case of tDQSCKmin, and based on this determination the memory control unit 4 starts detection of the DQS signal. The DQS signal detection start time is desirably after starting output of the read preamble signal in a case of tDQSCKmax (at timing after ts in FIG. 1). If it is possible to start detection of the DQS signal between ts and te in FIG. 1, in subsequent processing it is possible to receive read data in a procedure the same as processing flow of FIG. 2, as shown in FIG. 2. Moreover, the DQS signal detection start time determined by the DQS signal detection start time determination unit 5 desirably starts at as delayed a time as possible, within a time-period from ts to te in FIG. 1. Since power consumption increases in the time during which a gate is open in order for the memory controller to detect the DQS signal, if the detection start time is delayed, the power consumption of the memory controller can be decreased by a corresponding amount.

Since, among functions processed by the memory controller 2, a process requiring real time (detection of DQS signal, reading of data, and the like) cannot easily be carried out by software processing, a dedicated circuit is provided. But in the DQS signal detection start time determination unit 5, if time from giving a read command to starting the DQS signal detection is determined in advance, this time may be set thereafter in the memory control unit 4, so that real time processing is not required in the DQS signal detection start time determination unit 5 or the preamble length determination unit 6.

Next, FIG. 6 is an overall configuration diagram of a semiconductor memory device 1. In FIG. 6, 10 is a memory cell array, 11 is a row decoder that decodes a row address and drives a selected word line, 12 is a sense amplifier, 13 is a column decoder that decodes a column address and selects a selected bit line, 14 is a command decoder that receives as input a prescribed address signal and a command signal (chip select /CS, row address strobe /RAS, column address strobe /CAS, write enable /WE) and decodes a command, 15 is a control logic part, 16 is a column address buffer/burst counter, 17 is a mode register that receives addresses A0 to A13 and signals BA0, BA1, and BA2 for bank selection (selection of one from among 8 banks), 18 is a row address buffer, 19 is a refresh counter circuit that counts up when a refresh control signal REFC, and outputs a count output as a refresh address, 20 is a clock generator, 21 is a data input-output terminal (DQ terminal) for inputting and outputting read-write data to and from the outside, 24 is a DLL circuit, 25 is a data input-output unit that uses a clock given by a DLL or a clock generated from an external clock and performs input and output of data between the DQ terminal and the memory cell array 10.

Moreover, the mode register 17 is provided with, in addition to the read preamble register 73, a CAS latency specification register that specifies CAS latency, which is omitted from FIG. 6, and a DLL selection register that switches between a DLL selection mode and a DLL non-selection mode. Output of this DLL selection register is inputted to a DLL selection circuit 31, and selection is possible as to whether to use a clock whose phase is adjusted by the DLL circuit 24, as an internal clock inputted to the DQS output control circuit 32, or to use an internal clock whose phase, which has not been adjusted by the DLL circuit 24, is delayed, as it is, as a clock of the DQS control circuit 32. When a setting is made to the DLL non-selection mode, the DLL circuit 24 is OFF, and it is possible to reduce power consumption consumed by the DLL circuit 24. In addition, when a setting is made to the DLL non-selection mode, a power supply of the DLL circuit may be arranged to automatically turn off. Furthermore, in a case where the DLL selection mode and the non-selection mode are dynamically switched, since time is required from when the DLL is put ON to a locked state in which the DLL is stable, in a case where the DLL non-selection mode is switched to the DLL selection mode, first a switch is made from a DLL-OFF to a DLL-ON state, there is a waiting period until the DLL locks (for example, the CK signal is 512 clocks), and switching may take place automatically from the DLL non-selection mode to the DLL selection mode.

Moreover, a DQS output control circuit 32 that controls output of a strobe signal DQS outputted when data is read and a DQS output buffer 33 are provided, and when a read command is executed, timing is adjusted by the DQS output control circuit 32, and after a read preamble signal whose length is specified by the read preamble register 73 is outputted, a DQS signal amplified by the DQS output buffer 33 is outputted from the DQS terminal 22. In addition, data is outputted from the DQ terminal 21 in synchronization with output of the DQS signal. Furthermore, when a write command is executed, a data strobe signal is received from the DQS terminal 22, and data is taken in by a data input-output unit 25 from the DQ terminal in synchronization with the DQS signal adjusted by the DQS input buffer 34.

Figure 7:
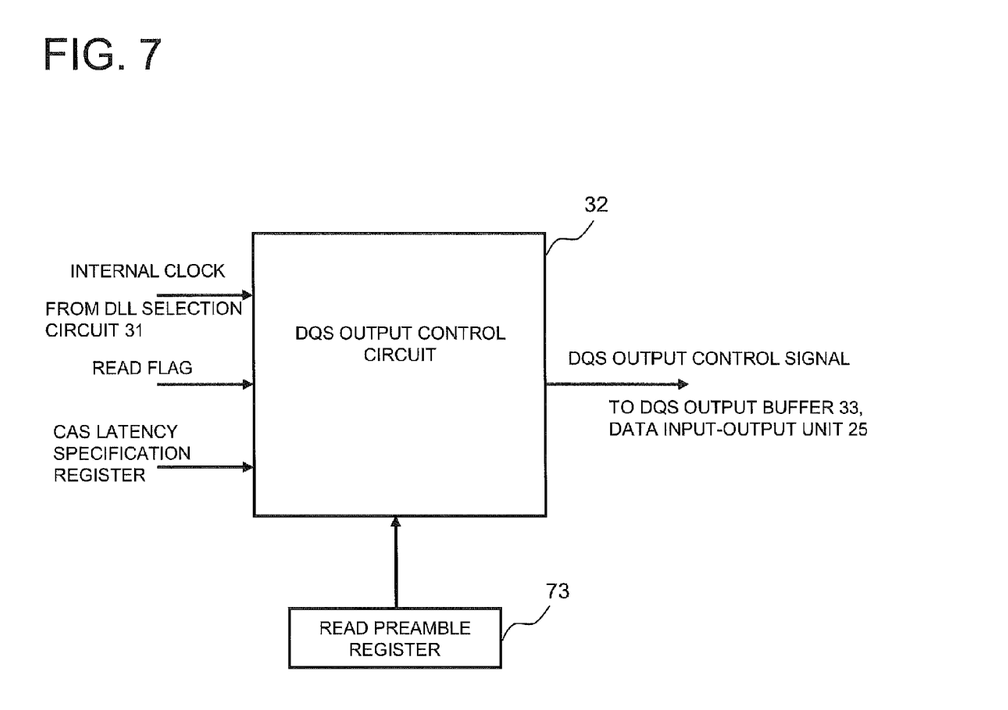
FIG. 7 is a configuration diagram of a DQS (data strobe signal) output control circuit vicinity of the semiconductor memory device according to one exemplary embodiment of the present invention.

FIG. 7 is a circuit block diagram of the DQS output control circuit 32 and vicinity thereof. The DQS output control circuit 32 receives a supply of an internal clock from the DLL selection circuit 31, to operate. In addition, an output signal of the read preamble register 73, a read flag not shown in the drawings, and an output signal of a CAS latency specification register are received by the DQS output control circuit 32; the read flag is an internal flag that is set when a read command is inputted, and is reset when output of the read data ends. Furthermore, an output signal of the DQS output control circuit 32 is also a timing control signal of read data output of the data input-output unit 25, in addition to the DQS output buffer circuit 33.

Figure 8:
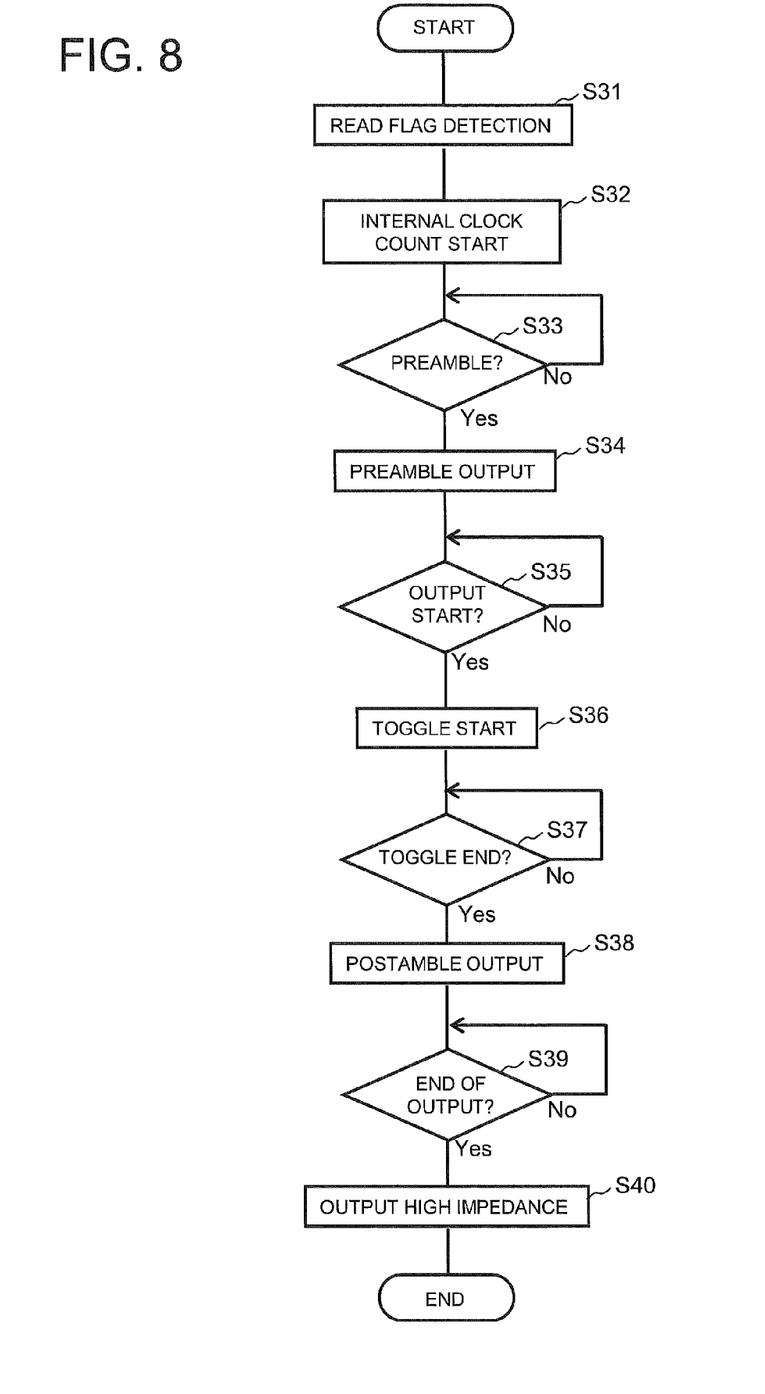
FIG. 8 is a control flow diagram of a DQS output control circuit of a semiconductor memory device according to one exemplary embodiment of the present invention.

FIG. 8 is an operation flow chart of the DQS output control circuit 32. The DQS output control circuit 32 starts processing by detection of the read flag set when the read command is inputted (step S31). When setting of the read flag is detected, a count of the internal clock is started (step S32). A count of the internal clock is continued until read preamble signal output timing, decided by the read preamble register 73 prior to the read data output start timing decided in advance by the CAS latency specification register, is reached (step S33), and when the internal clock is counted until preamble signal output timing, output of the preamble signal is started (step S34). The DQS output control circuit 32 continues the count of the internal clock, and when the output timing of the read data decided by the CAS latency specification register is reached (step S35), toggle output of the DQS signal is started. Together with the DQS signal toggle, the read data is outputted from the DQ terminal (step S36). This toggle operation continues until read data output of a prescribed burst length is completed (step S37). When the data output of the prescribed burst length is completed, a postamble signal is outputted (step S38), and when output of the postamble signal is completed (step S39), the DQS terminal returns to a high impedance state, and output processing of the read data is completed (step S40).

FIG. 9 is a functional configuration diagram of the read preamble register 73. As shown in FIG. 9, if the read preamble register 73 is a register of a 3-bit configuration, it is possible to select a maximum of 8 read preamble lengths. In FIG. 9, by a setting of the read preamble length register, the read preamble length is from 5 selections, from 1 system clock 1 period (1 tCK) to 5 periods (5 tCK). In addition, the read preamble length can be selected not for each 1 period of the system clock but in half period units.

Figure 10:
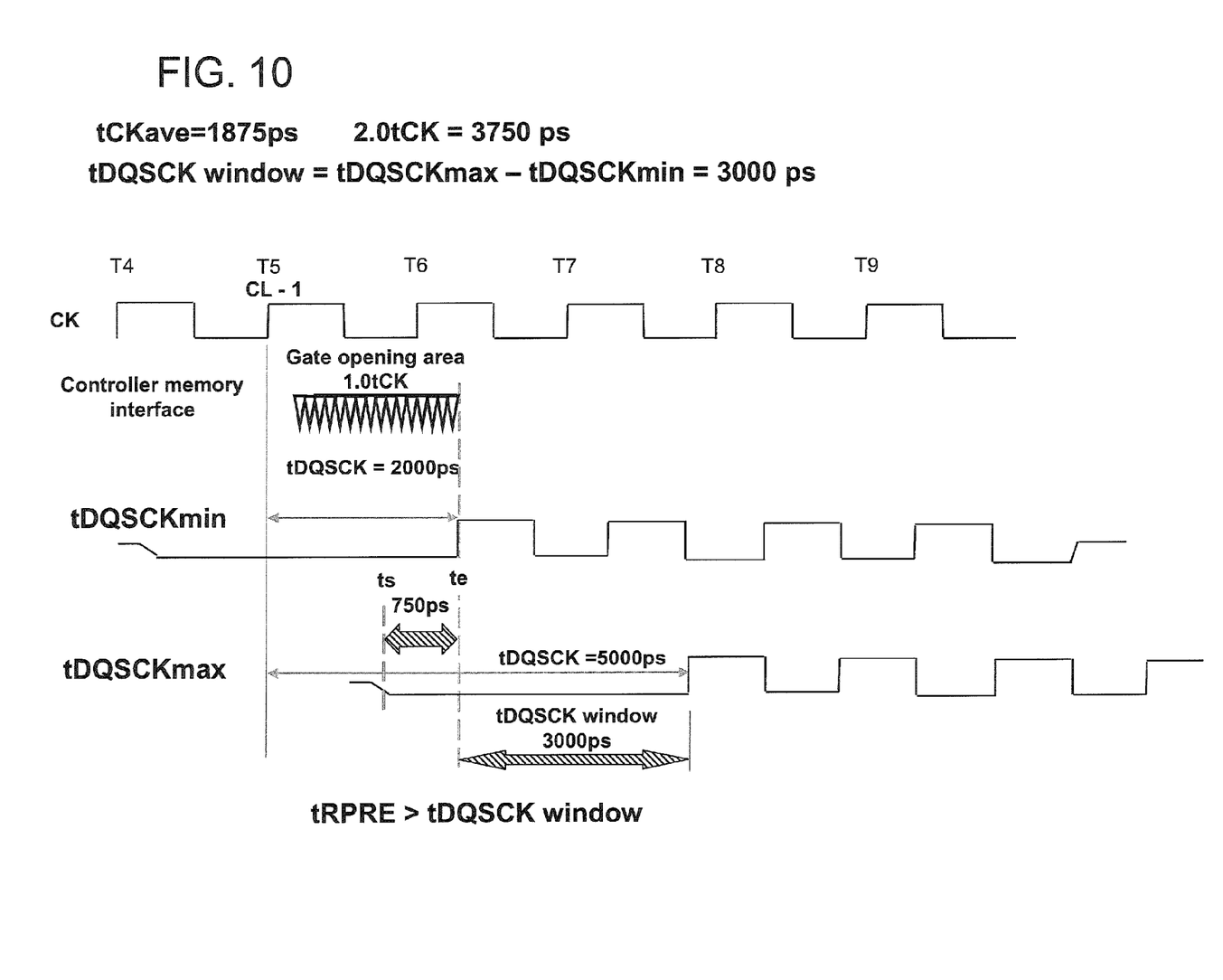
FIG. 10 is a timing diagram for a memory system (data transmission system) according to one exemplary embodiment of the present invention.

FIG. 10 is a timing diagram when the read command is executed in a case where a bit Az=0, a bit Ay=0, and a bit Ax=1 are set to the read preamble register specification value of FIG. 9, with the same conditions as in FIG. 3, and the read preamble length is an amount of 2 system clock periods (2 tCK). Since an average period of the system clock tCK is tCKave=1875 ps, the read preamble length tRPRE=2.0 tCK=3750 ps. Furthermore, since a time difference of tDQSCKmax and tDQSCKmin is tDQSCKwindow=tDQSCKmax−tDQSCKmin=3000 ps, then tRPRE>tDQSCKwindow. If this relationship of tRPRE>tDQSCKwindow is satisfied, in a time of tRPRE−tDQSCKwindow only, a tDQSCKmax preamble is entered before the tDQSCKmin preamble finishes. That is, if the length of time in which preamble times of tDQSCKmax and tDQSCKmin overlap is tse, Expression (2) below holds.

$$tse = tRPRE - (tDQSCK\max - tDQSCK\min) \quad \text{Expression (2)}$$

That is, the preamble length determination unit 6 of the memory controller may determine the read preamble time-period tRPRE so that tse>0. In this regard, in FIG. 10, tse=3750 ps−3000 ps=750 ps. Therefore, in this time-period it is desirable that the memory controller 2 starts detection of the DQS signal at timing between ts and te in FIG. 10. The DQS signal detection start time determination unit 5 of the memory controller 2 determines the DQS signal detection start time so as to start detection of the DQS signal at timing after ts and up to te.

In the abovementioned exemplary embodiment, considering the memory controller 2 as a controller that controls data transmission, the semiconductor memory device 1 as a controlled device that responds to an instruction from the controller to perform input and output of data with respect to the controller, a DQ bus as a transmission data line that connects the controller and the controlled device and performs input and output of data, a DQS signal line as a bidirectional transmission clock line that connects the controller and the controlled device and when the controller performs input of data from the controlled device, transmits a transmission clock generated by the system clock to the controller from the controlled device and transmits input data in synchronization with a transmission clock to the data transmission line, and a read preamble register as a preamble length register that decides the length of the preamble signal outputted to the transmission clock line prior to the controlled device starting transmission of the data to the controller, the present invention is clearly not limited to the memory system 50 and can be applied to a data transmission system for transmission between a controller and a controlled device outside of the semiconductor memory device.

An additional mode of the present invention, a method of controlling a read preamble signal of a semiconductor memory device includes: operating in synchronization with a system clock provided from outside, outputting a data strobe signal from a data strobe terminal when a read command is executed, and outputting read data in synchronization with the data strobe signal, having a DLL selection mode in which phase is adjusted with respect to the system clock using a DLL circuit, to output read data, and a DLL non-selection mode in which read data is outputted with an internal clock as a reference, without using the DLL circuit, and outputting the read preamble signal from the data strobe terminal prior to output of the read data; wherein length of the read preamble signal is lengthened with respect to the period of the system clock in the DLL non-selection mode more than in the DLL selection mode.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A system, comprising:
   a controller comprising a plurality of first external terminals configured to supply a command and an address, to communicate data, and to communicate a strobe signal related to the data; and
   a semiconductor memory device comprising a plurality of second external terminals corresponding to the plurality of first external terminals,
   the semiconductor memory device further comprising a system clock external terminal provided to receive a system clock with a first frequency or a second frequency,
   one of the plurality of first external terminals and one of the plurality of second external terminals transferring an information specifying a length of a preamble of the strobe signal before the semiconductor memory device communicates the data, the length of the preamble including first and second lengths corresponding to the first and second frequencies, respectively.

2. The system as claimed in claim 1, the device further comprising:
   a data strobe signal output control circuit configured to output the preamble of the strobe signal and then output a toggle transition of the data strobe signal to communicate the data.

3. The system as claimed in claim 1, wherein the more the frequency of the system clock is increased, the longer the length of the preamble is.

4. The system as claimed in claim 3, wherein the larger a CAS latency is, the longer the length of the preamble is.

5. The system as claimed in claim 3, wherein the length of the preamble is changed enough that the controller includes a gate opening area, which overlaps the length of the preamble, so that the controller can receive the data from the memory device.

6. The system as claimed in claim 1, wherein the data strobe signal is transferred from the semiconductor memory device to the controller when performing a read operation.

7. The system as claimed in claim 1, the controller further comprising:
   a preamble length determination unit configured to determine the length of the preamble.

8. The system as claimed in claim 7, wherein the preamble length determination unit determines the length of the preamble based on a variation of a delay time of the strobe signal.

9. The system as claimed in claim 7, wherein the preamble length determination unit determines the length of the preamble for each of a fixed time interval.

10. A system, comprising:
    a controller comprising a plurality of first external terminals configured to supply a command and an address, to communicate data, and to communicate a strobe signal related to the data; and
    a plurality of semiconductor memory devices, each semiconductor memory device comprising a plurality of second external terminals corresponding to the plurality of first external terminals,
    each of the semiconductor memory devices further comprising a system clock external terminal provided to receive a system clock with a first frequency or a second frequency,
    one of the plurality of first external terminals and one of the plurality of second external terminals transferring an information specifying a length of a preamble of the strobe signal before the semiconductor memory device communicates the data, the length of the preamble including first and second lengths corresponding to the first and second frequencies, respectively.

11. The system as claimed in claim 10, wherein at least one of said plurality of semiconductor memory devices further comprises:
    a delay locked loop (DLL) circuit; and
    a DLL selection circuit that can select a DLL selection mode, which sets the DLL circuit in an activate mode, and a DLL non-selection mode, which sets the DLL circuit in a deactivate mode.

12. The system as claimed in claim 11, wherein the length of the preamble is used to communicate data only during the deactivate mode.

13. The system as claimed in claim 10, wherein the controller further comprises a preamble length determination unit that determines the length of the preamble.

14. The system as claimed in claim 13, wherein the preamble length determination unit performs a data read test for the semiconductor memory device to determine the length of the preamble.

15. The system as claimed in claim 13, wherein the preamble length determination unit determines the length of the preamble at a system start-up time.

16. The system as claimed in claim 13, wherein the preamble length determination unit determines the length of the preamble for each of a fixed time interval.

17. The system as claimed in claim 13, wherein the preamble length determination unit determines the length of the preamble based on a variation of a delay time of the strobe signal.

18. The system as claimed in claim 10, wherein the preamble comprises a read preamble.

19. The system as claimed in claim 18, wherein the data strobe signal is transferred from the semiconductor memory device to the controller when performing a read operation.

20. A method of communicating data to and from semiconductor memory devices,
    for a controller comprising a plurality of first external terminals configured to supply a command and an address, to communicate data, and to communicate a strobe signal related to the data, and,
    for a semiconductor memory device comprising a plurality of second external terminals corresponding to the plurality of first external terminals,
    the semiconductor memory devices further comprising a system clock external terminal provided to receive a system clock with a first frequency or a second frequency, the method comprising
    allocating one of the plurality of first external terminals and one of the plurality of second external terminals for transferring an information specifying a length of a preamble of the strobe signal before the semiconductor memory device communicates the data, the length of the preamble including first and second lengths corresponding to the first and second frequencies, respectively.

* * * * *

UNITED STATES PATENT AND TRADEMARK OFFICE
CERTIFICATE OF CORRECTION

PATENT NO. : 8,582,337 B2  
APPLICATION NO. : 13/832592  
DATED : November 12, 2013  
INVENTOR(S) : Atsuo Koshizuka Page 1 of 1

It is certified that error appears in the above-identified patent and that said Letters Patent is hereby corrected as shown below:

On the Title Page

In the Related U. S. Application Data (60), replace with the following paragraph:

Divisional Application of U. S. Patent Application No. 13/621,074, filed on September 15, 2012, now U. S. Patent No. 8,811,054, which is a Continuation Application of U. S. Patent Application No. 13/465,845, filed on May 7, 2012, now Abandoned, which is a Continuation Application of U. S. Patent Application No. 12/656,060 filed on January 14, 2010, now U. S. Patent No. 8,199,546.

Signed and Sealed this  
Fourteenth Day of July, 2015

Michelle K. Lee  
*Director of the United States Patent and Trademark Office*